United States Patent
Soyano

(10) Patent No.: US 9,076,782 B2
(45) Date of Patent: Jul. 7, 2015

(54) SEMICONDUCTOR DEVICE AND METHOD OF MANUFACTURING SAME

(75) Inventor: Shin Soyano, Shiojiri (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/118,112

(22) PCT Filed: Jun. 14, 2012

(86) PCT No.: PCT/JP2012/065224
§ 371 (c)(1),
(2), (4) Date: Nov. 15, 2013

(87) PCT Pub. No.: WO2013/021726
PCT Pub. Date: Feb. 14, 2013

(65) Prior Publication Data
US 2014/0084438 A1 Mar. 27, 2014

(30) Foreign Application Priority Data
Aug. 10, 2011 (JP) ................. 2011-174540

(51) Int. Cl.
*H01L 23/495* (2006.01)
*H01L 23/00* (2006.01)
(Continued)

(52) U.S. Cl.
CPC .......... *H01L 23/49575* (2013.01); *H01L 24/73* (2013.01); *H01L 2224/48137* (2013.01);
(Continued)

(58) Field of Classification Search
CPC .......... H01L 2224/48091; H01L 2924/00014; H01L 2224/73265; H01L 2224/32225; H01L 2224/48227; H01L 2924/00; H01L 2224/92247; H01L 2224/45124; H01L 2224/48472; H01L 2924/01047; H01L 2924/01015; H01L 2224/37147; H01L 2924/01026; H01L 2924/01029; H01L 2924/01042; H01L 2224/291; H01L 24/73; H01L 24/92; H01L 24/48; H01L 25/072; H01L 24/37; H01L 24/40; H01L 24/84; H01L 23/3735; H01L 23/49844; H01L 23/49575; H01L 24/81
USPC ........................................... 257/676; 438/123
See application file for complete search history.

(56) References Cited

U.S. PATENT DOCUMENTS 5,590,144 A * 12/1996 Kitamura et al. ............... 372/36
2007/0069344 A1  3/2007 Yamashita et al.
(Continued)

FOREIGN PATENT DOCUMENTS

JP     2002-110750 A    4/2002
JP     2003-243608 A    8/2003
(Continued)

OTHER PUBLICATIONS

Europe Patent Office, "Search Report for EP 12822675.0," Aug. 19, 2014.

*Primary Examiner* — Walter H Swanson
(74) *Attorney, Agent, or Firm* — Manabu Kanesaka

(57) ABSTRACT

A semiconductor device has a plurality of electronic components mounted on an insulating substrate formed with a metal layer, and electrically connected to each other or to the metal layer; a positioning wire member having a predetermined diameter and a predetermined length, and bonded to each of the plurality of electronic components or to the metal layer; a lead frame disposed to bridge and electrically connect the plurality of electronic components to each other or between the metal layer and the electronic components; and an opening having a size capable of inserting the wire member therethrough formed to penetrate through the lead frame, to join the lead frame to each of the electronic components or the metal layer at a predetermined position therein. The lead frame is positioned on the insulating substrate by inserting the wire member into the opening.

13 Claims, 12 Drawing Sheets

(51) Int. Cl.
*H01L 25/07* (2006.01)
*H01L 23/373* (2006.01)
*H01L 23/498* (2006.01)
H01L 23/31 (2006.01)
H01L 25/18 (2006.01)
H01L 23/24 (2006.01)

(52) U.S. Cl.
CPC ............ H01L2224/73265 (2013.01); H01L 2224/32225 (2013.01); H01L 2224/48091 (2013.01); H01L 2924/01029 (2013.01); H01L 2224/40137 (2013.01); H01L 2224/40139 (2013.01); H01L 2224/40227 (2013.01); H01L 2224/37011 (2013.01); *H01L 24/92* (2013.01); H01L 2224/45124 (2013.01); H01L 2224/45147 (2013.01); H01L 2224/48227 (2013.01); H01L 2224/73221 (2013.01); H01L 2224/85205 (2013.01); H01L 2224/92247 (2013.01); H01L 2924/13055 (2013.01); H01L 2224/92166 (2013.01); *H01L 25/072* (2013.01); *H01L 24/48* (2013.01); H01L 2224/48472 (2013.01); H01L 23/3107 (2013.01); *H01L 24/32* (2013.01); *H01L 24/37* (2013.01); *H01L 24/40* (2013.01); H01L 24/45 (2013.01); *H01L 24/83* (2013.01); H01L 24/85 (2013.01); H01L 25/18 (2013.01); H01L 2224/04026 (2013.01); H01L 2224/04034 (2013.01); H01L 2224/04042 (2013.01); H01L 2224/06181 (2013.01); H01L 2224/37147 (2013.01); H01L 2224/73263 (2013.01); H01L 2224/83815 (2013.01); H01L 2924/1203 (2013.01); H01L 2224/40993 (2013.01); H01L 2924/01015 (2013.01); H01L 2924/01047 (2013.01); *H01L 24/81* (2013.01); H01L 24/06 (2013.01); H01L 24/29 (2013.01); *H01L 24/84* (2013.01); H01L 2224/291 (2013.01); *H01L 23/3735* (2013.01); H01L 23/49524 (2013.01); *H01L 23/49844* (2013.01); H01L 23/24 (2013.01); H01L 2224/84138 (2013.01); H01L 2924/1305 (2013.01)

(56) References Cited

U.S. PATENT DOCUMENTS

| | | | |
|---|---|---|---|
| 2008/0150102 A1* | 6/2008 | Yokomae et al. | 257/675 |
| 2010/0155924 A1* | 6/2010 | Knapp et al. | 257/690 |
| 2010/0295187 A1 | 11/2010 | Tsuruoka et al. | |

FOREIGN PATENT DOCUMENTS

| | | |
|---|---|---|
| JP | 2007-335538 A | 12/2007 |
| JP | 2008-182074 A | 8/2008 |
| JP | 2009-170543 A | 7/2009 |
| JP | 2009-253131 A | 10/2009 |
| JP | 2010-141163 A | 6/2010 |
| JP | 3163214 U | 10/2010 |
| JP | 2011-086743 A | 4/2011 |
| JP | 2011-142172 A | 7/2011 |

* cited by examiner

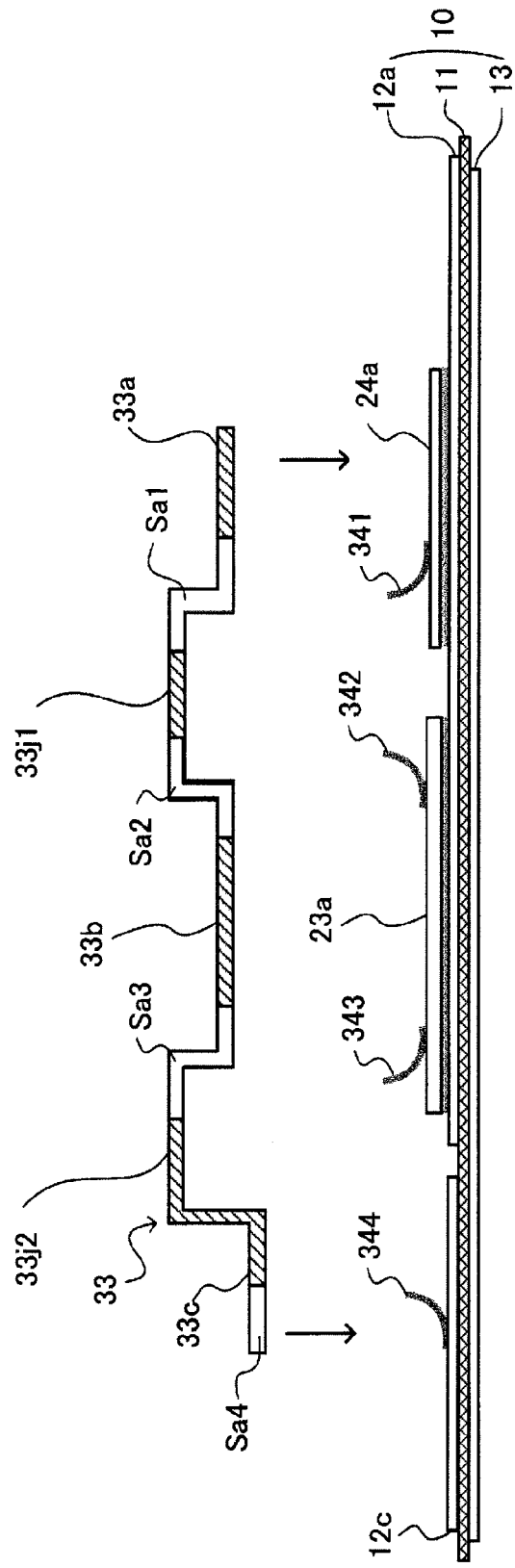

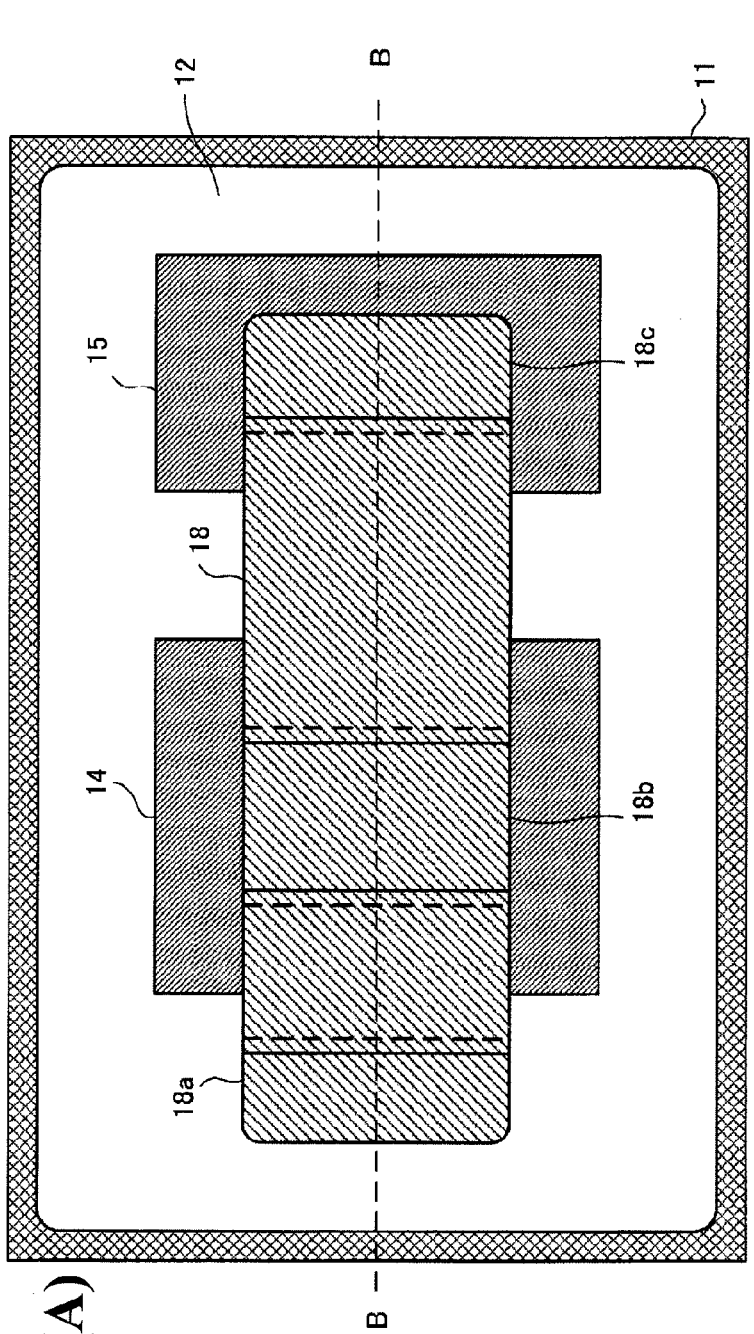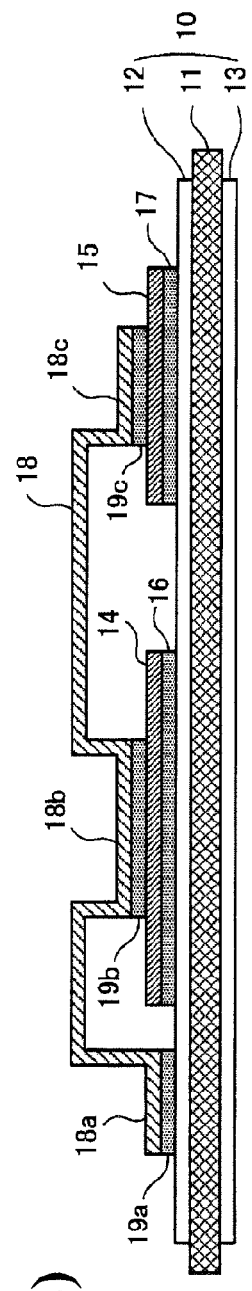
Fig. 11(A) Prior Art
Fig. 11(B) Prior Art

SEMICONDUCTOR DEVICE AND METHOD OF MANUFACTURING SAME

RELATED APPLICATIONS

The present application is National Phase of International Application No. PCT/JP2012/065224 filed Jun. 14, 2012, and claims priority from Japanese Applications No. 2011-174540 filed Aug. 10, 2011.

TECHNICAL FIELD

The present invention relates to a semiconductor device having a module structure in which a plurality of electronic components is mounted on an insulating substrate formed with a metal layer, and a method of manufacturing such a semiconductor device. Particularly, the present invention relates to a semiconductor device that is configured by electrically connecting electronic components such as semiconductor chips on an insulating substrate to each other or to a metal layer, and relates to a method of manufacturing such a semiconductor device.

BACKGROUND ART

Among the semiconductor devices equipped with small, large-current electronic components, there is a semiconductor device in which semiconductor chips are fixed to a metal layer (conductive pattern) on an insulating substrate via solder layers. In this type of semiconductor device, when mounting electronic components on the metal layer formed on the insulating substrate, the solder layers are likely to shift toward the periphery on the metal layer, and spread to an end of the metal layer or even to the other electronic components mounted on the metal layer.

When the solder layers spread toward an end of the metal layer, a section on the insulating substrate near the end of the metal layer is exposed to large stress when the entire semiconductor device is heated by the heat generated from the electronic components. This can cause cracks on the periphery of each solder layer, damaging the electric connection in the semiconductor device. The solder layers spreading toward the other electronic components can also result in having an impact on how these electronic components are joined.

Therefore, in the semiconductor device equipped with small, large-current electronic components, a lead frame formed from a metal plate can be used as a wiring member in place of a conventional aluminum or copper wire so as to secure a current capacity and realize a cooling mechanism for releasing the heat of the electronic components to the outside while absorbing it. The lead frame can be soldered, at either end, to the electronic components, e.g. electrodes of semiconductor chips, and a conductive pattern formed on the insulating substrate. As a result, electrical connection between the semiconductor chips or between the conductive pattern and the semiconductor chips can be secured, and at the same time the lead frame itself can function to release the heat of the semiconductor chips to the outside. Such a lead frame is configured generally by a copper plate, copper alloy (Cu—Fe—Cu, Al—Fe, CuMo), or the like.

FIGS. 11(A), 11(B) are diagrams showing an example of a conventional semiconductor device, wherein FIG. 11(A) is a plan view of the semiconductor device and FIG. 11(B) is a cross-sectional view taken along the line B-B.

A ceramic substrate 11 is an insulating substrate 10 which is formed by joining conductive patterns 12, 13, formed from metal layers of a predetermined shape, to either side of the ceramic substrate 11, to configure a semiconductor device of a module structure to be soldered onto an upper surface of a base substrate, not shown. In this semiconductor device, a semiconductor chip 14 and a diode chip 15, which form an insulated gate bipolar transistor (IGBT), are loaded in predetermined positions on the conductive pattern 12 on the front side of the ceramic substrate 11 via solder layers 16, 17, respectively, and a metal plate 18 is disposed thereon as a wiring member, the semiconductor chip 14 being referred to as "IGBT chip" below. As described above, the metal plate 18 is formed widely as a lead frame to electrically connect the IGBT chip 14 and the diode chip 15 to each other and to the conductive pattern 12, in such a manner as to release the heat of the chips 14, 15 to the outside while absorbing it.

Such a metal plate 18 forming a lead frame is positioned on the insulating substrate 10, with predetermined size of solder plates 19a, 19b, 19c interposed therebetween, and then joined to the insulating substrate 10 by melting the solder plates 19a, 19b, 19c in a single reflow step. In so doing, prior to the reflow step, joining surfaces 18a, 18b, 18c of the metal plate 18 need to be disposed in predetermined positions on the insulating substrate 10 along with the respective solder plates 19a, 19b, 19c. In particular, when assembling a small, large-current semiconductor device, the metal plate 18 is required to be positioned correctly.

FIG. 12 is a plan view showing a positioning frame body used for positioning the lead frame of the conventional semiconductor device.

A positioning frame body 20 is a frame body (segment) positioned and disposed in a predetermined position on the conductive pattern 12 by the IGBT chip 14 and the diode chip 15 mounted thereon. This positioning frame body 20 defines a single closed region with a frame 20a that determines a range on the left-hand side of the IGBT chip 14 in the conductive pattern 12, an outer circumferential frame 20b of the IGBT chip 14, an outer circumferential frame 20c of the diode chip 15, and a connecting frame 20d connecting the outer circumferential frames 20b, 20c to each other. Consequently, the position on the conductive pattern 12 where the metal plate 18 shown in FIGS. 11(A), 11(B) should be disposed (shown by the virtual line 18i in the diagram) can be determined.

Patent Document 1: Japanese Patent Application Publication No. 2009-170543
Patent Document 2: Japanese Patent Application Publication No. 2009-253131

In such a conventional semiconductor device, when soldering an ordinary lead frame onto the chips 14, 15, the solder plates 19b, 19c are often shifted in the front-back and right-left directions. This makes it difficult to correctly position the solder plates 19b, 19c in the positions of the electrodes of the IGBT chip 14 and the diode chip 15. It is also difficult to make the thickness of the solder layers uniform, the solder layers being used for joining the metal plate 18 to the insulating substrate 10 by melting the solder plates 19a, 19b, 19c in a single reflow step. Especially when there is a big difference in thermal expansion coefficient between the metal plate 18 and each of the chips 14, 15, the thickness of each solder layer becomes non-uniform. Or when the area for a solder fillet becomes insufficient, sufficient long-term reliability of the solder joints cannot be achieved because of thermal stress.

With the downsizing of the semiconductor device itself, it is difficult to correctly position the metal plate 18 and the solder plates 19a, 19b, 19c at the same time, oven when the conventional positioning frame body 20 is used. Therefore, the problem to be solved is how to release the heat of the chips 14, to the outside efficiently. As described above, the problem in assembling the lead frame of the conventional semiconductor device is difficulty in positioning the metal plate 18 and the like on the insulating substrate 10, therefore, positions for joining them together is unstable.

The present invention was contrived in view of the circumstances described above, and an object thereof is to provide a semiconductor device of improved reliability and ease of assembly associated with the downsizing thereof, in which a long life of a solder joining a lead frame having a large current capacity and efficient release of heat from the lead frame can be achieved, and to also provide a method of manufacturing such a semiconductor device.

DISCLOSURE OF THE INVENTION

In order to solve the foregoing problems, the present invention provides a semiconductor device in which a plurality of electronic components is mounted on an insulating substrate formed with a metal layer and the electronic components are electrically connected to each other or to the metal layer, the semiconductor device comprising: a positioning wire member having a predetermined diameter and a predetermined length, and bonded to each of the electronic components or to the metal layer; a lead frame disposed to bridge and electrically connect the plurality of electronic components to each other or between the metal layer and the electronic components; and an opening having a size capable of inserting the wire member therethrough formed to penetrate through the lead frame, to join the lead frame to each of the electronic components or the metal layer at a predetermined position therein. The lead frame is positioned on the insulating substrate by inserting the wire member into the opening.

A method of manufacturing a semiconductor device according to the present invention is a method of manufacturing a semiconductor device in which a plurality of semiconductor chips mounted on an insulating substrate formed with a conductive pattern is electrically connected to each other or to the conductive pattern by a lead frame, the method comprising: a first joining step for joining the semiconductor chips to the conductive pattern on the insulating substrate through joining materials; a wire bonding step for bonding positioning wires having a predetermined diameter and a predetermined length to positions on main surfaces of the semiconductor chips or a main surface of the conductive pattern to which the lead frame is joined; a positioning step for preparing the lead frame having opening portions each having a size capable of inserting the positioning wires therethrough, and then positioning the lead frame with the positioning wires when connecting the plurality of semiconductor chips to each other or to the conductive pattern on the insulating substrate; and a second joining step of joining joints of the lead frame to the semiconductor chips or the conductive pattern at predetermined positions therein through solder layers.

The present invention can easily and reliably position the lead frame and solder plates at the same time without using a conventional positioning frame body. In addition, efficient release of heat from the lead frame can be achieved without reducing the shelf life of the solder layers through which the lead frame is joined to the insulating substrate. The present invention, therefore, can provide a semiconductor device of improved reliability and ease of assembly associated with the increased current and downsizing thereof.

The above and other objects, features and advantages of the present invention will become apparent from the following description thereof taken with the accompanying drawings illustrating a preferred embodiment of the present invention.

BRIEF DESCRIPTION OF THE DRAWINGS

FIGS. 1(A), 1(B) are diagrams showing an example of a semiconductor device according to a first embodiment, wherein FIG. 1(A) is a plan view of the semiconductor device and FIG. 1(B) is a cross-sectional view taken along the line B-B.

FIGS. 6(A), 6(B) are diagrams showing an example of a semiconductor device according to a second embodiment, wherein FIG. 6(A) is a plan view of the semiconductor device and FIG. 6(B) is a cross-sectional view taken along the line B-B.

FIGS. 8(A), 8(B) are diagrams showing a modification of lead frames used in the semiconductor device according to the second embodiment, wherein FIG. 8(A) is a plan view of the modified lead frames and FIG. 8(B) is a cross-sectional view taken along the line B-B.

FIG. 9 is a cross-sectional view showing a modification of positioning wire members used in the semiconductor device according to the second embodiment.

FIGS. 10(A)-10(C) are diagrams showing an example of a lead frame used in a semiconductor device according to a third embodiment, wherein FIG. 10(A) is a plan view of the lead frame, FIG. 10(B) is a cross-sectional view taken along the line B-B, and FIG. 10(C) is a partial cross-sectional enlarged view.

FIGS. 11(A), 11(B) are diagrams showing an example of a conventional semiconductor device, wherein FIG. 11(A) is a plan view of the semiconductor device and FIG. 11(B) is a cross-sectional view taken along the line B-B.

BEST MODE FOR CARRYING OUT THE INVENTION

Embodiments of the present invention are now described hereinafter with reference to the drawings.

First Embodiment

Figure 1:
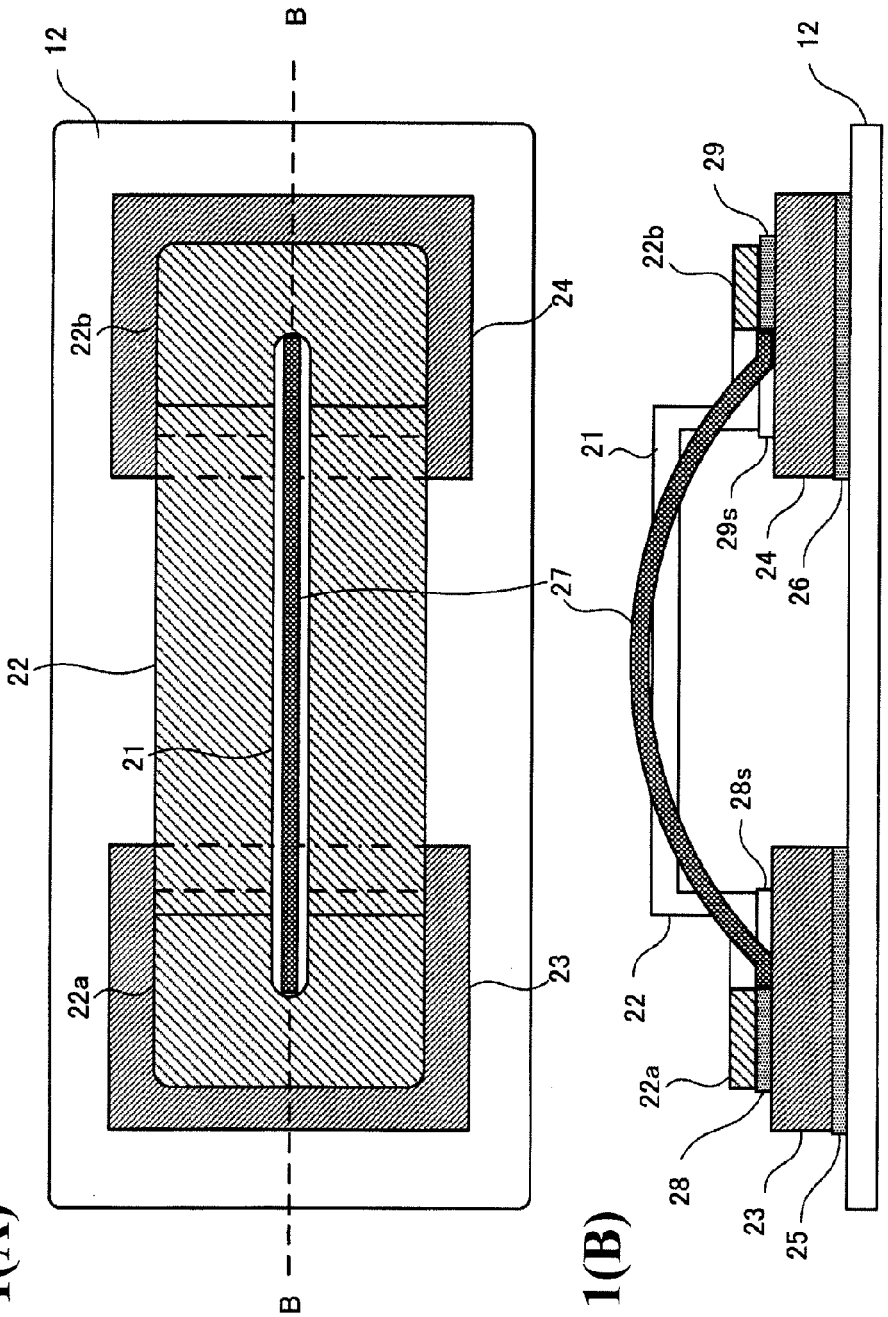

FIGS. 1(A), 1(B) are diagrams showing an example of a semiconductor device according to a first embodiment, where FIG. 1(A) is a plan view of the semiconductor device and FIG. 1(B) is a cross-sectional view taken along the line B-B.

This semiconductor device is configured such that electronic components 23, 24 on an insulating substrate (not shown) formed with a metal layer constituting a conductive pattern 12 are electrically connected to each other by a rectangular lead frame 22 having an opening 21. The lead frame has joints 22a, 22b which are sized corresponding to electrode surfaces of the electronic components 23, 24, at left and right ends of the lead frame, and, as shown in FIG. 1(B), these joints 22a, 22b electrically connect the electronic components 23, 24 to each other via rising portions of a predetermined height provided in the lead frame 22. The opening of the lead frame 22 is formed as a long hole having a predetermined width and a length equivalent to the distance between the joints 22a and 22b in a longitudinal direction of the lead frame 22 and penetrating through the lead frame 22.

As shown in FIG. 1(B), the electronic components 23, 24 are joined beforehand at predetermined positions on the conductive pattern 12 by joining materials 25, 26, respectively, and both ends of an aluminum or copper wire member 27 are bonded to each other by the electrode surfaces of the two electronic components 23, 24. The wire member 27 has a diameter corresponding to the width of the opening 21 of the lead frame 22 (e.g., 300 to 500 µm) and is disposed to connect the electronic components 23, 24 linearly to each other at the central portions thereof.

The lead frame 22 can be positioned correctly by inserting the wire member 27 bridging between the two electronic components 23, 24 into the opening 21 penetrating through the lead frame 22. At this moment, solder plates 28, 29, are sandwiched between the electrode surfaces of the electronic components 23, 24 and the joints 22a, 22b of the lead frame 22, and are melted in a subsequent reflow step. As will be shown in FIG. 2, slits 28s, 29s that are sized corresponding to the width of the opening 21 of the lead frame 22 are formed in the solder plates 28, 29, respectively.

Figure 2:
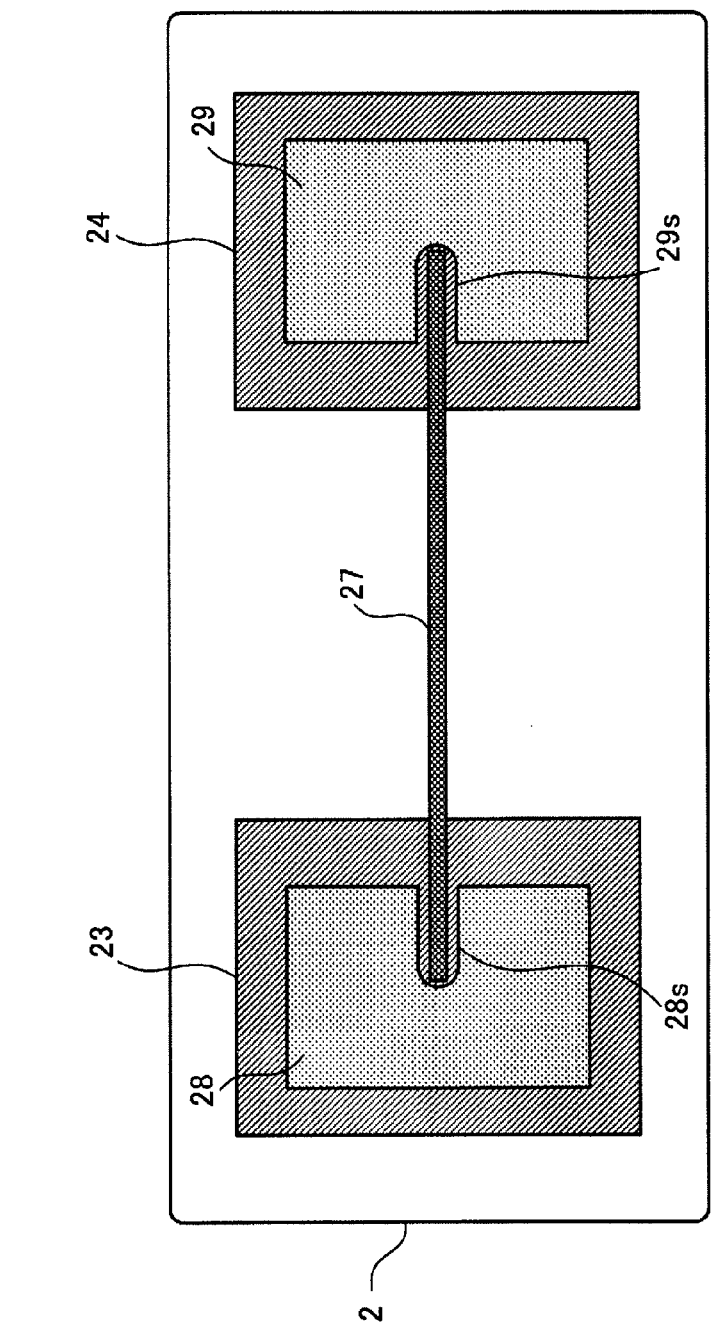
FIG. 2 is a plan view showing the shape of solder plates to which a lead frame is joined.

FIG. 2 is a plan view showing the shape of the solder plates to which the lead frame is joined.

The solder plates 28, 29 are sized corresponding to the electrode surfaces of the electronic components 23, 24 and are provided with the predetermined slits 28s, 29s beforehand. The solder plates 28, 29 can be positioned by engaging the slits 28s, 29s with the bonding surfaces of the wire member 27 which are bonded to the electrode surfaces. In addition, the positions of the joints 22a, 22b of the lead frame 22 that are joined to the electrode surfaces of the electronic components 23, 24 via the solder plates 28, 29 are determined similarly by the wire member 27, as described above.

Figure 12:
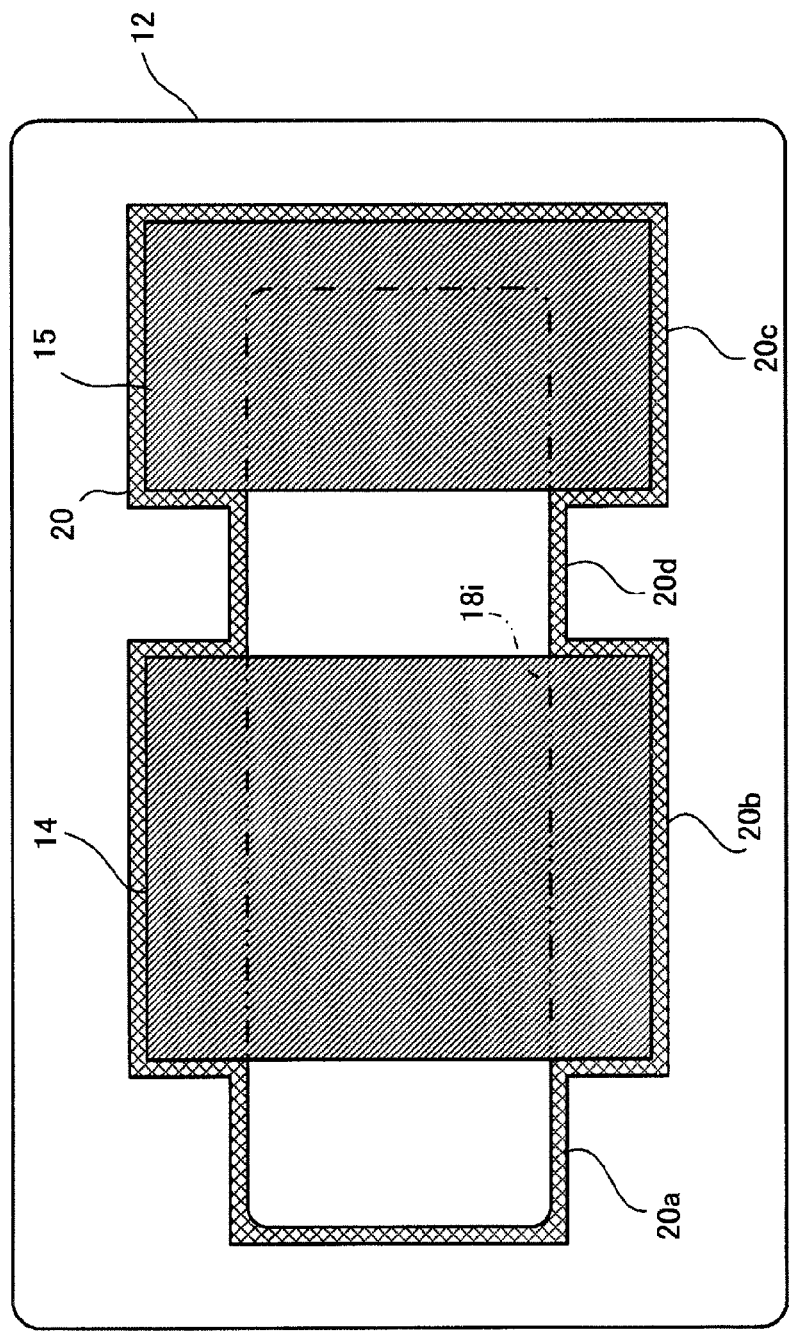
FIG. 12 is a plan view showing a positioning frame body used for positioning a lead frame of the conventional semiconductor device.

Therefore, the lead frame 22 and the solder plates 28, 29 can correctly be positioned on the conductive pattern 12, easily and reliably, without using such a thing as the conventional positioning frame body (FIG. 12). Due to the presence of the opening 21 provided in the joints 22a, 22b of the lead frame 22, the solder plates 28, 29 to be melted in the reflow step can be formed into fillets of a sufficiently large area or long length along the shape corresponding to the slits 28s, 29s. For this reason, the joints 22a, 22b of the lead frame 22 become less likely to form cracks, making the semiconductor device more reliable, the cracks occurring generally at outer circumferential portions thereof due to temporal variation of thermal stress applied thereto.

Figure 3:
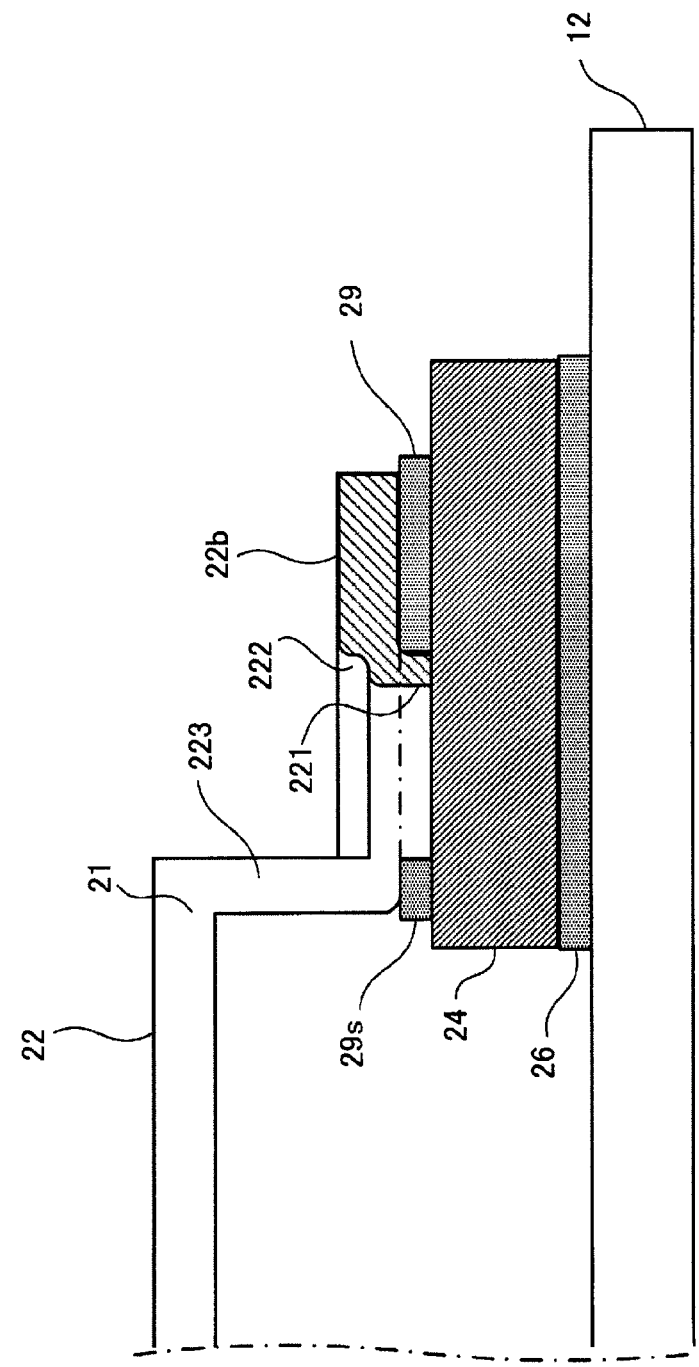
FIG. 3 is a diagram showing a projection formed on a lower surface of a joint of the lead frame.

FIG. 3 is a diagram showing a projection formed on a lower surface of a joint of the lead frame.

FIG. 3 shows an enlargement of the parts near the joint 22b of the lead frame 22. A projection 221 is formed on a lower surface of the joint 22b projecting downward along the rim of the opening 21, the lower surface of the joint 22b meaning a connecting surface (rear surface) of the joint 22b that is connected to the electronic component 24. This projection 221 is as thick as the solder plate 29 and is small enough to be fitted into the slit 29s of the solder plate 29. A step portion 222 is formed on the front side of the opening 21 at the joint 22b of the lead frame 22. The joint 22b of the lead frame 22 is described here, but the joint 22a is also provided with the same projection 221 and step portion 222.

The lead frame 22 can be positioned, while the projections 221 are directly contacting the electrode surfaces of the electronic components 23, 24, respectively. Thus, the lead frame 22 of the semiconductor device can reliably be positioned by the wire member 27 not only in the front-back and right-left directions but also in the horizontal (vertical) direction. As a result, the thickness of joining layers formed by the solder plates 28, 29 becomes uniform, achieving efficient release of the heat of the electronic components 23, 24 to the outside.

Figure 4A:
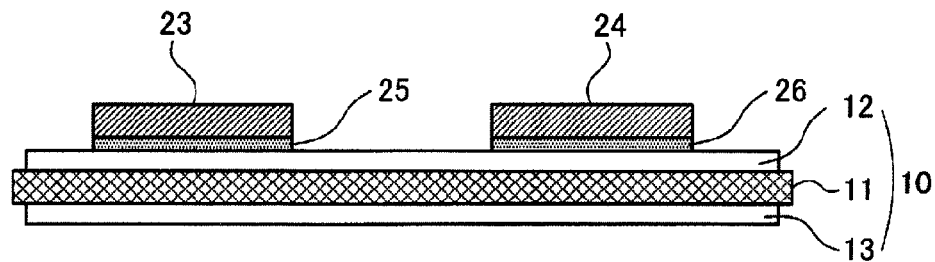
FIGS. 4(A)-4(C) are diagrams showing steps of manufacturing the semiconductor device according to the first embodiment.
Figure 4B:
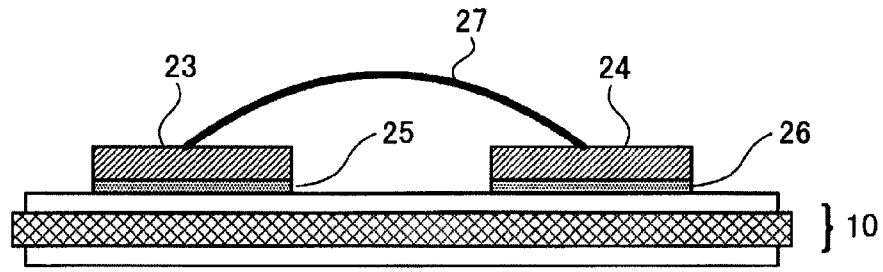
Figure 4C:
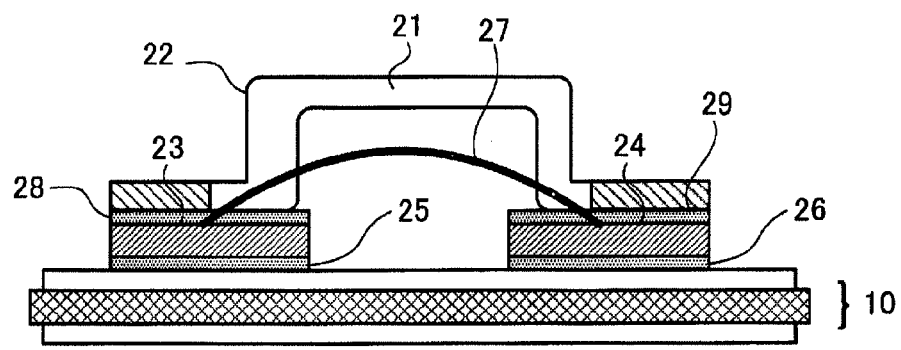

FIGS. 4(A)-4(C) are diagrams showing steps of manufacturing the semiconductor device according to the first embodiment.

FIG. 4(A) shows an insulating substrate 10 in which conductive patterns 12, 13 configured by metal layers of a predetermined shape are joined and formed on either side of a ceramic substrate 11, and the electronic components 23, 24 that are joined to the conductive pattern 12 via joining materials 25, 26. A first joining step is executed by heating this entire structure in a furnace or the like to melt the joining materials 25, 26 so that the electronic components 23, 24 are joined in predetermined positions on the conductive pattern 12 of the insulating substrate 10.

In the step shown in FIG. 4(B), the wire member 27 is bonded by ultrasound. In this step, the ends of the positioning wire member 27 with a predetermined diameter and a predetermined length are bonded to predetermined positions on main surfaces of the respective electronic components 23, 24 to which the lead frame 22 is joined. In so doing, another electrode and an external terminal can be bonded to each other at the same time by using another bonding wire.

FIG. 4(C) shows a step of positioning the lead frame 22 and the solder plates 28, 29 simultaneously on the conductive pattern 12. The opening 21 that is sized such that the positioning wire member 27 can be inserted therethrough is previously formed in the lead frame 22 used here. The predetermined slits 28s, 29s shown in FIG. 2, too, are previously formed in the solder plates 28, 29. Then, the lead frame 22 and the solder plates 28, 29 that are positioned on the insulating substrate 10 are heated and melted in a furnace or the like, so that the lead frame 22 is fixated between the electronic components 23, 24, thereby ending the second joining step.

Finally, the insulating substrate 10 is fixed in a base, and the electronic components 23, 24, the conductive pattern 12, and the lead frame 22 are sealed by epoxy resin or gel, thereby completing a semiconductor device.

Note that the second joining step of fixating the lead frame 22 is carried out based on the first joining step of joining the electronic components 23, 24 onto the conductive pattern 12. However, in a case where the electronic components are connected to the conductive pattern by the lead frame, the first joining step and the second joining step can be performed at the same time.

Figure 5:
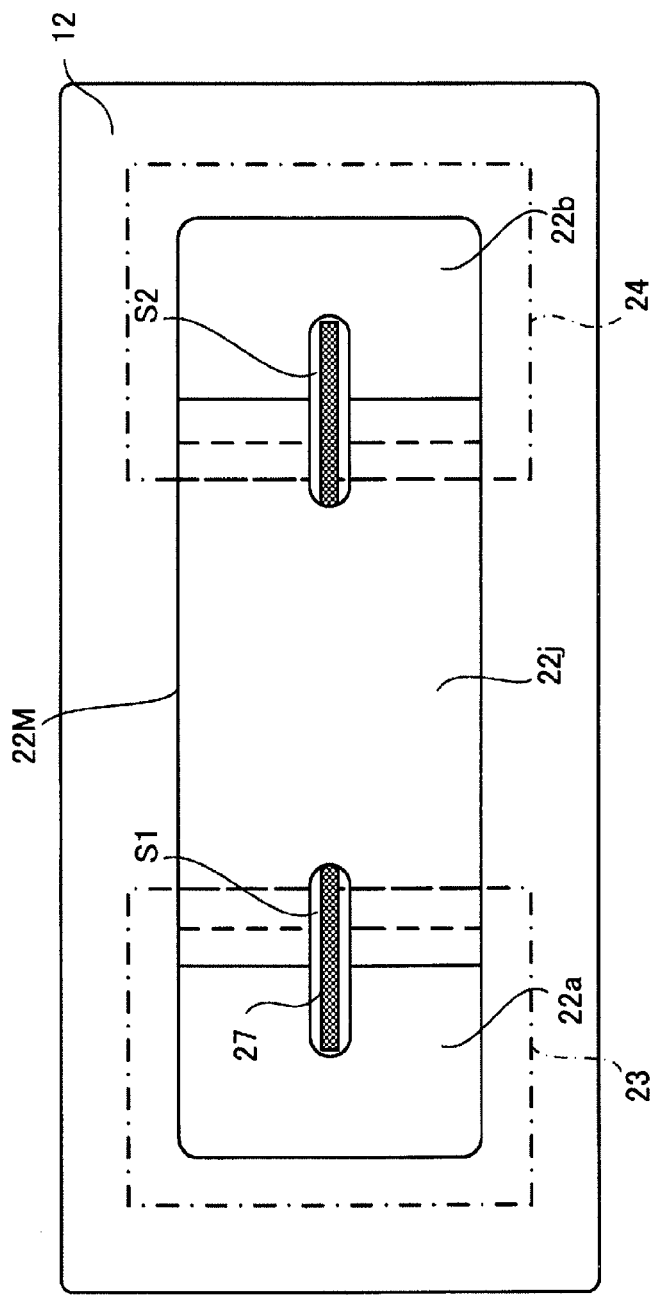
FIG. 5 is a plan view showing a modification of the lead frame used in the semiconductor device according to the first embodiment.

FIG. 5 is a plan view showing a modification of the lead frame used in the semiconductor device according to the first embodiment.

In a lead frame 22M, a modification of the lead frame according to the first embodiment, the opening 21 is divided into two long holes S1, S2. The long hole S1 extends from the joint 22a of the lead frame 22M across a rising portion coupled to a connector 22j, while the long hole S2 extends from the joint 22b across a rising portion coupled to the connector 22j. In this manner, the long holes S1, S2 are formed to extend in a longitudinal direction of the lead frame 22M. As a result, the two joints 22a, 22b are connected to each other by this wide connector 22j which does not have an opening. Therefore, the lead frame 22M exposed to the heat of the two electronic components 23, 24 can efficiently release the heat to the outside through this wide connector 22j.

Second Embodiment

Figure 6A:
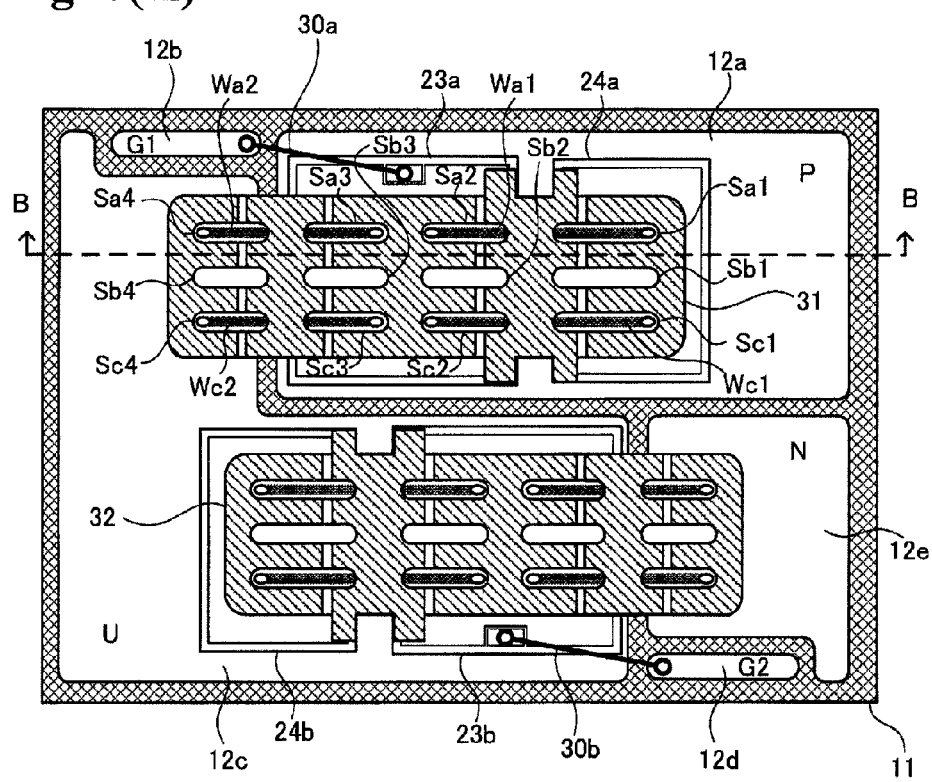
Figure 6B:
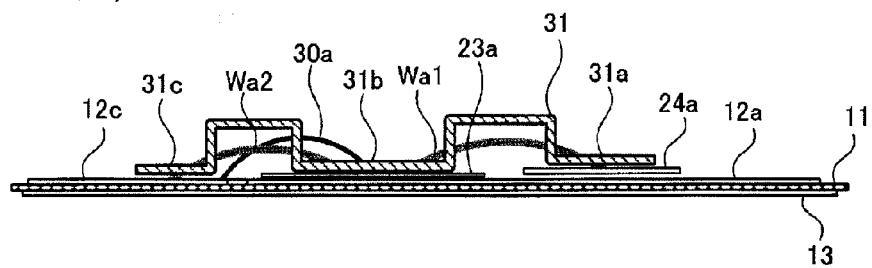
Figure 7:
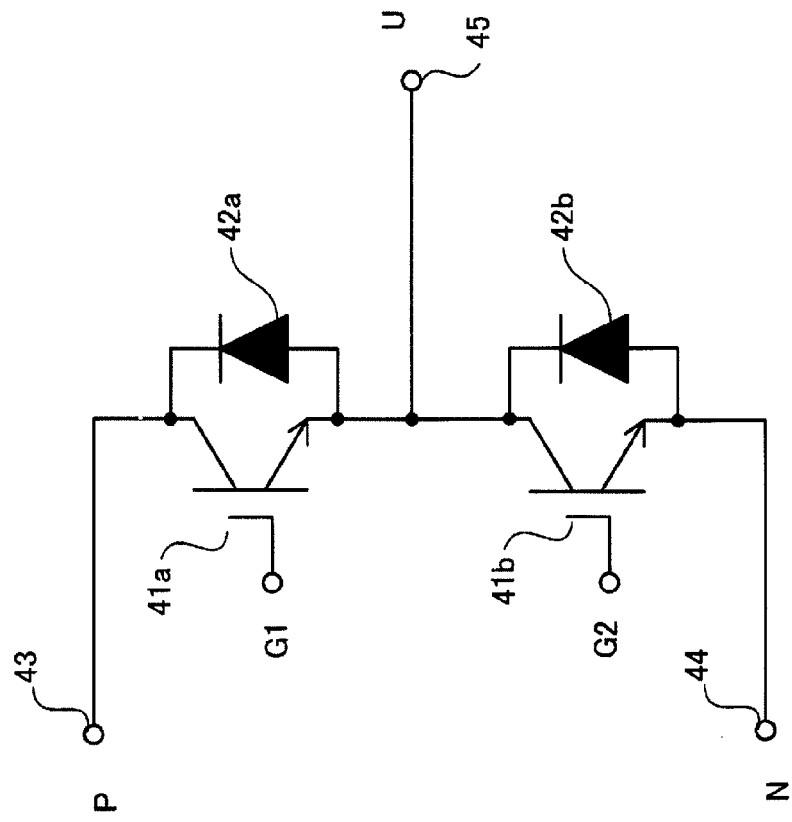
FIG. 7 is a diagram showing an equivalent circuit of the semiconductor device according to the second embodiment.

FIGS. 6(A), 6(B) are diagrams showing an example of a semiconductor device according to a second embodiment, where FIG. 6(A) is a plan view of the semiconductor device and FIG. 6(B) is a cross-sectional view taken along the line B-B. FIG. 7 is a diagram showing an equivalent circuit of the semiconductor device according to the second embodiment.

In the semiconductor device shown in these diagrams, an insulating substrate formed of a ceramic substrate 11 is joined/mounted onto a several millimeter thick metal base plate via a tin (Sn)-silver (Ag) based lead-free solder layer (not shown). Power semiconductor elements such as IGBT chips 23a, 23b and diode chips 24a, 24b are loaded on the ceramic substrate 11. In this semiconductor device, the power semiconductor elements, the insulating substrate and the like are packaged in a resin case to configure an all-purpose IGBT module. A power semiconductor element module normally has a two-in-one structure formed of two elements of upper and lower arms or a six-in-one structure formed of six elements, and, when configuring an inverter, generally three modules each having the two-in-one structure are connected in parallel or a single module having the six-in-one structure is used.

This embodiment illustrates a semiconductor device in which the two IGBT chips 23a, 23b and the two diode chips 24a, 24b are disposed as the electronic components which configure a semiconductor module (power module) corresponding to one phase of an inverter circuit.

Five, divided conductive patterns 12a to 12e are disposed on the ceramic substrate 11. The IGBT chip 23a and the diode chip 24a mounted on the conductive pattern 12a configure an IGBT 41a and a diode 42a which are connected to a positive (P) DC terminal 43 shown in FIG. 7. A gate terminal G1 of the IGBT 41a is connected to the conductive pattern 12b by a wire 30a for wiring which extends from the IGBT chip 23a.

Surface electrodes of the IGBT chip 23a and the diode chip 24a are electrically connected to the conductive pattern 12c configuring an output terminal (U terminal) 45, by a first lead frame 31. The IGBT chip 23b and the diode chip 24b that configure an IGBT 41b and a diode 42b are mounted on the conductive pattern 12c, in which surface electrodes of the IGBT chip 23b and the diode chip 24b are electrically connected to the conductive pattern 12e configuring a negative (N) DC terminal 44, by a second lead frame 32. A gate terminal G2 of the IGBT 41b is connected to the conductive pattern 12d by a wire 30b for wiring which extends from the IGBT chip 23b.

These two lead frames 31, 32 are used in this semiconductor device. For instance, the lead frame 31 has three joints 31a, 31b, 31c, as shown in FIG. 6(B). The joints 31a, 31b, 31c have three long holes Sa1 to Sc1, Sat to Sc2, Sa3 to Sc3, and Sa4 to Sc4, which are disposed in parallel at regular intervals in a width direction of the lead frame 31, to cut across the rising portions of the lead frame 31. Positioning wire members Wa1 and Wc1 for connecting the surface electrodes of the diode chip 24a and the IGBT chip 23a to each other are bonded respectively to the positions corresponding to the outer long holes Sa1 and Sa2 and the outer long holes Sc1 and Sc2, and positioning wire members Wa2 and Wc2 for connecting the surface electrode of the IGBT chip 23a and the conductive pattern 12c to each other are bonded respectively to the positions corresponding to the outer long holes Sa3 and Sa4 and the outer long holes Sc3 and Sc4. The same is true for the lead frame 32.

In the semiconductor device configuring a semiconductor module corresponding to one phase of an inverter circuit, therefore, the two lead frames 31 and 32 can be positioned easily and reliably, forming the wiring corresponding to the equivalent circuit shown in FIG. 7.

Figures 8A, 8B:
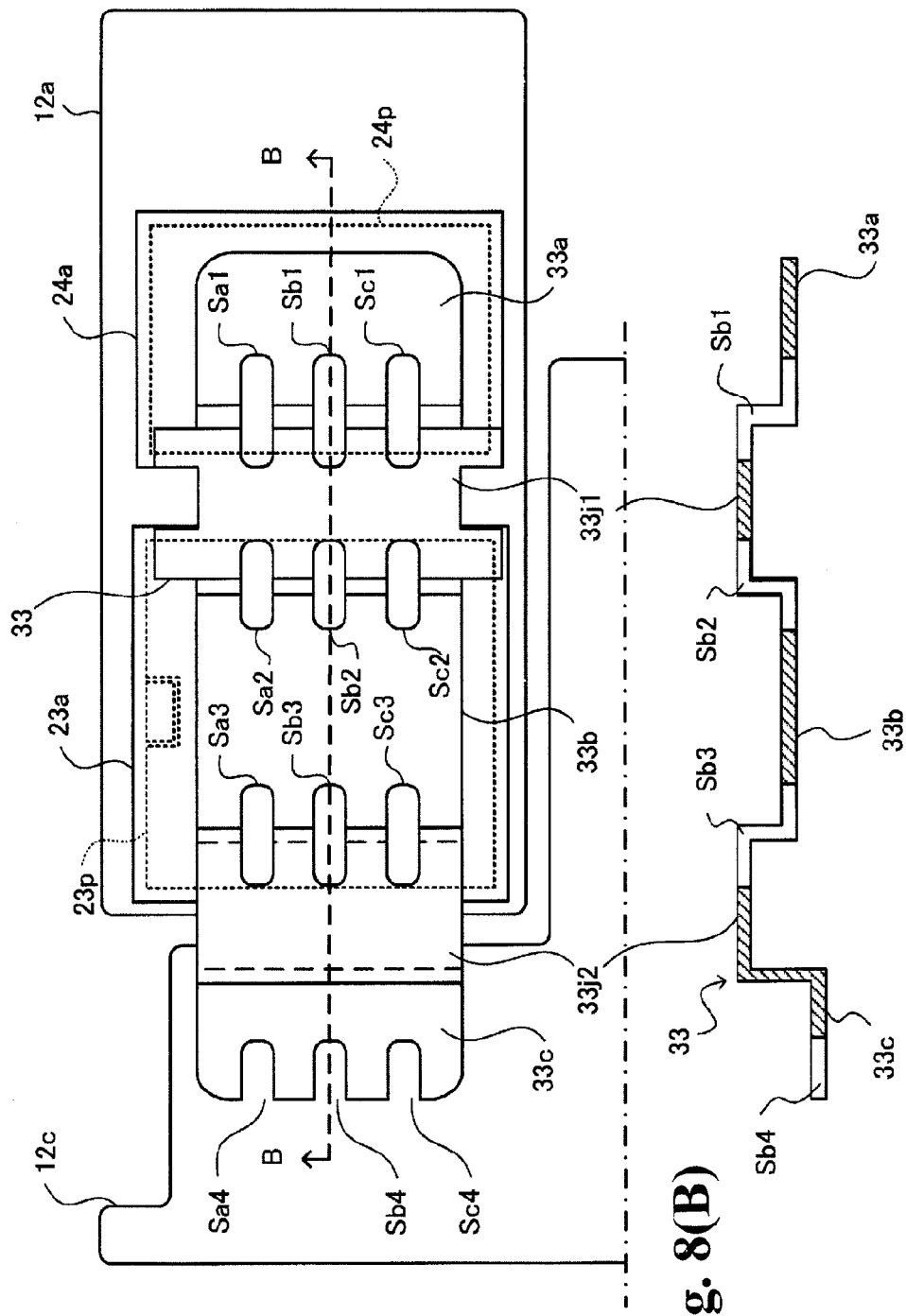

FIGS. 8(A), 8(B) are diagrams showing a modification of the lead frames used in the semiconductor device according to the second embodiment, wherein FIG. 8(A) is a plan view of the modified lead frames and FIG. 8(B) is a cross-sectional view taken along the line B-B.

A lead frame 33, a modification of the lead frame 31 shown in FIGS. 6(A), 6(B), is different from the lead frame 31 in that the three long holes Sa1 to Sc1, Sa2 to Sc2, Sa3 to Sc3, and Sa4 to Sc4 that are disposed in parallel in the width direction are made short. For example, the long holes Sa1 to Sc1 in a joint 33a connected to the diode chip 24a are shorter than those shown in FIG. 6(A). Also, the long holes Sa2 to Sc2 and Sa3 to Sc3 penetrating through a joint 33b connected to the IGBT chip 23a are shorter than those shown in FIG. 6(A). In addition, U-shaped long holes Sa4 to Sc4 are formed in a joint 33c connected to the conductive pattern 12c, in such a manner as to not cut across the rising portion of the lead frame 33.

Thus, heat from the diode chip 24a and the IGBT chip 23a can be transmitted to the lead frame 31 and released efficiently to the outside.

FIG. 9 is a cross-sectional view showing a modification of positioning wire members used in the semiconductor device according to the second embodiment.

Wire members 341 to 344 have their ends on one side bonded to the diode chip 24a, the IGBT chip 23a, and a predetermined position on the conductive pattern 12c. As long as these wire members 341 to 344 are long enough to project at least above the long holes Sa1 to Sa4 penetrating through the lead frame 33, it is very possible to position the lead frame 33 on the insulating substrate 10, bringing about an advantage that the wire members are not wasted.

Note that the metal plate of the lead frame 33 has a higher thermal expansion coefficient than the semiconductors of the chips 23a, 24a. For this reason, deflection of the metal plate can be absorbed by forming the long holes Sa1 to Sa3 in such a manner as to penetrate through the rising portion of the lead frame 33.

Third Embodiment

Figure 10A:
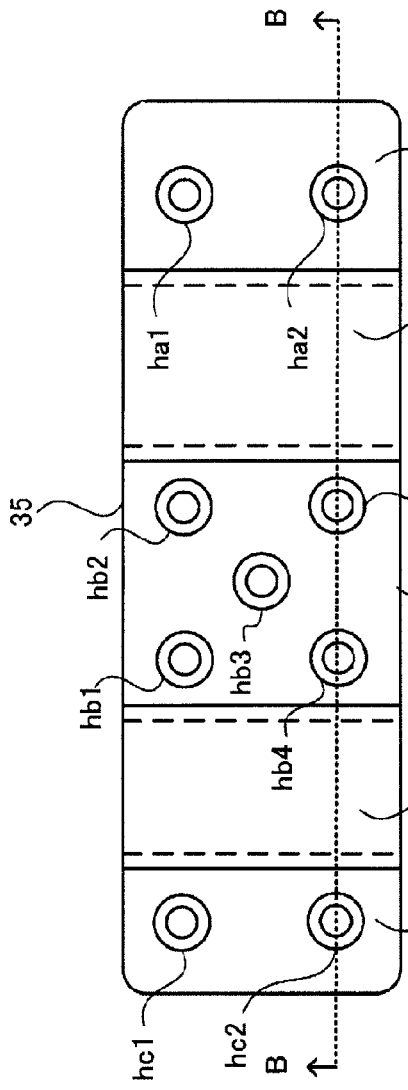
Figure 10B:
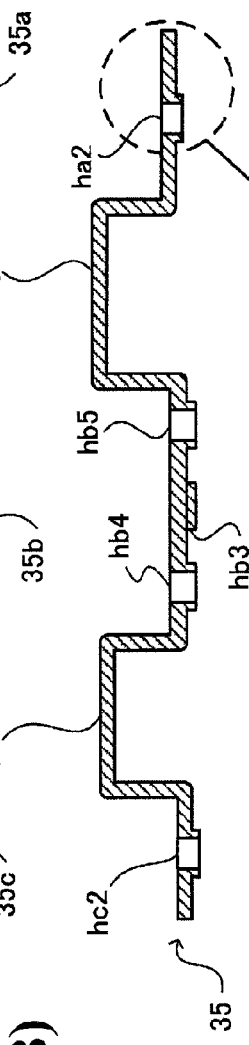
Figure 10C:
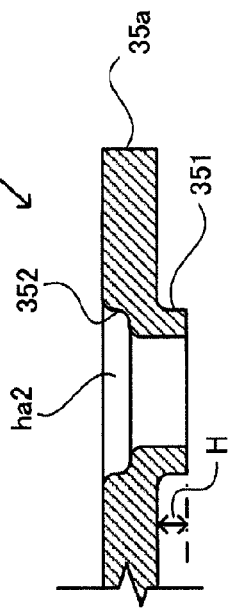

FIGS. 10(A)-10(C) are diagrams showing an example of a lead frame used in a semiconductor device according to a third embodiment, wherein FIG. 10(A) is a plan view of the lead frame, FIG. 10(B) is a cross-sectional view taken along the line B-B, and FIG. 10(C) is a partial cross-sectional enlarged view.

In place of the long holes of the lead frame 33 shown in FIGS. 8(A), 8(B), stepped round holes ha1, ha2, hb1 to hb5, hc1, and hc2 are formed in such a manner as to penetrate through joints 35a to 35c in this lead frame 35. As shown in the enlarged cross-sectional view of FIG. 10(C), a projection 351 projecting downward is formed on the back of the stepped round hole ha2 (on the side joined to the insulating substrate). A step portion 352 is formed on the front side of the stepped round hole ha2. Note that the height H of the projection 351 is equivalent to the thickness of a solder plate used as a joining material.

In this case as well, the lead frame 35 can easily be positioned on the insulating substrate by the positioning wire members (FIG. 9) described as the modification of the second embodiment. In addition, the thickness of the joining layers for joining the lead frame 35 can easily be made uniform, achieving efficient release of the heat of the electronic components 23, 24 to the outside.

The foregoing description merely illustrates the principle of the present invention. In addition, various modifications and changes can be made by a person skilled in the art. The present invention is not limited to the precise configurations and applications shown and described above. Accordingly, all suitable modifications and equivalents are considered to fall within the scope of the present invention as defined in the appended claims and their equivalents.

EXPLANATION OF REFERENCE NUMERALS

10 Insulating substrate
11 Ceramic substrate
12, 13 Conductive pattern
21 Opening
22, 31, 32, 33, 35 Lead frame
23, 24 Electronic component
23a, 23b IGBT chip
24a, 24b Diode chip
25, 26 Joining material
27, 341 to 344, Wa1, Wc1, Wa2, Wc2 Wire member
28, 29 Solder plate
28s, 29s Slit
30a, 30b Wire for wiring
ha1, ha2, hb1 to hb5, hc1, hc2 Stepped round hole
S1, S2, Sa1 to Sc1, Sa2 to Sc2, Sa3 to Sc3, Sa4 to Sc4 Long hole

What is claimed is:

1. A semiconductor device, comprising:
a plurality of electronic components mounted on an insulating substrate formed with a metal layer, and electrically connected to each other or to the metal layer;
a positioning wire member having a predetermined diameter and a predetermined length, and bonded to each of the plurality of electronic components or to the metal layer, to protrude upwardly therefrom;
a lead frame disposed to bridge and electrically connect the plurality of electronic components to each other or between the metal layer and the electronic components; and
an elongated opening formed in the lead frame to penetrate therethrough and having a size capable of inserting the wire member therethrough, to join the lead frame to each of the electronic components or the metal layer at a predetermined position therein,
wherein the wire member is located in the elongated opening of the lead frame so that the lead frame is positioned on the insulating substrate.

2. The semiconductor device according to claim 1, wherein the lead frame comprises:
at least a pair of joints contacting the electronic components or the metal layer,
rising portions rising from each of the pair of joints, and
a connector connecting the pair of joints to each other through the rising portions, and
the opening is a long hole formed extending in a longitudinal direction of the lead frame to bridge between the joints and the rising portions.

3. The semiconductor device according to claim 2, wherein the long hole is formed in the pair of joints in plurality arranged along a width direction of the lead frame.

4. The semiconductor device according to claim 1, wherein the lead frame has a projection formed on a lower surface side of a joint contacting one of the electronic components or the metal layer and projecting downward along a peripheral edge of the opening.

5. The semiconductor device according to claim 1, wherein the wire member is an aluminum wire or a copper wire having a diameter of 300 to 500 μm.

6. The semiconductor device according to claim 1, wherein the metal layer is a conductive pattern formed on both surfaces of the insulating substrate.

7. The semiconductor device according to claim 1, wherein the electronic components are semiconductor chips forming an IGBT or a diode, and
the IGBT and the diode are connected in inverse parallel by the lead frame.

8. The semiconductor device according to claim 1, wherein the insulating substrate is soldered to an upper surface of a base, and
the electronic components are thermally connected to a heat dissipating member through the base.

9. A semiconductor device, comprising:
a plurality of electronic components mounted on an insulating substrate formed with a metal layer, and electrically connected to each other or to the metal layer;
a positioning wire member having a predetermined diameter and a predetermined length, and bonded to each of the plurality of electronic components or to the metal layer;
a lead frame disposed to bridge and electrically connect the plurality of electronic components to each other or between the metal layer and the electronic components; and
an opening having a size capable of inserting the wire member therethrough and formed to penetrate through the lead frame, to join the lead frame to each of the electronic components or the metal layer at a predetermined position therein,
wherein the lead frame is positioned on the insulating substrate by inserting the wire member into the opening, and
wherein the wire member has one end bonded to a predetermined position in each of the plurality of electronic components or the metal layer, and has a length to at least project upward from the opening penetrating through the lead frame.

10. A method of manufacturing a semiconductor device in which a plurality of semiconductor chips mounted on an insulating substrate formed with a conductive pattern is electrically connected to each other or to the conductive pattern by a lead frame, the method comprising:
a first joining step for joining the semiconductor chips to the conductive pattern on the insulating substrate by joining materials;
a wire bonding step for bonding positioning wires having a predetermined diameter and a predetermined length to positions on main surfaces of the semiconductor chips or a main surface of the conductive pattern to which the lead frame is joined;
a positioning step for preparing the lead frame having opening portions each having a size capable of inserting the positioning wires therethrough, and then positioning the lead frame with the positioning wires when connecting the plurality of semiconductor chips to each other or to the conductive pattern on the insulating substrate; and a second joining step for joining joints of the lead frame to the semiconductor chips or the conductive pattern at predetermined positions therein through solder layers.

11. The method according to claim 10, wherein the wire bonding step is executed simultaneously with a step of bonding a wire for wiring to the conductive pattern.

12. The method according to claim 10, wherein the semiconductor chips, the conductive pattern, and the lead frame are sealed with epoxy resin or gel subsequent to the second joining step.

13. A semiconductor device, comprising:
an insulating substrate having a metal layer;
a plurality of electronic components mounted on the metal layer;
a wire member electrically bonding the plurality of electronic components together or bonding the metal layer to the plurality of electronic components, to project upwardly from bonding positions of the wire member; and
a lead frame electrically connecting the plurality of electronic components together or between the metal layer and the electronic components, and having an opening to which the wire member is inserted,
wherein the wire member has a length such that a part of the wire member projecting upwardly enters the opening, and
the wire member is located in the opening of the lead frame so that the lead frame is positioned on the insulating substrate.

* * * * *

UNITED STATES PATENT AND TRADEMARK OFFICE
CERTIFICATE OF CORRECTION

| | |
|---|---|
| PATENT NO. | : 9,076,782 B2 |
| APPLICATION NO. | : 14/118112 |
| DATED | : July 7, 2015 |
| INVENTOR(S) | : Shin Soyano |

It is certified that error appears in the above-identified patent and that said Letters Patent is hereby corrected as shown below:

Specification

Please change column 2, line 64, from "... time, oven when ..." to --... time, even when ...--.

Please change column 2, line 67, from "14, to the ..." to --14, 15 to the ...--.

Please change column 4, line 66, from "... The lead frame" to --... The lead frame 22--.

Please change column 5, line 5, from "... The opening of" to --... The opening 21 of--.

Please change column 7, line 46, from "... an IGBT 41h ..." to --... an IGBT 41b ...--.

Please change column 7, line 57, from "... Sc1, Sat to Sc2 ..." to --... Sc1, Sa2 to Sc2 ...--.

Signed and Sealed this
Ninth Day of February, 2016

Michelle K. Lee
*Director of the United States Patent and Trademark Office*